(12) United States Patent
Matsuo et al.

(10) Patent No.: US 10,304,850 B2
(45) Date of Patent: May 28, 2019

(54) SEMICONDUCTOR MEMORY DEVICE

(71) Applicant: Toshiba Memory Corporation, Minato-ku (JP)

(72) Inventors: Kazuhiro Matsuo, Kuwana (JP); Masayuki Tanaka, Yokkaichi (JP); Shinji Mori, Yokkaichi (JP); Kenichiro Toratani, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 80 days.

(21) Appl. No.: 15/011,911

(22) Filed: Feb. 1, 2016

(65) Prior Publication Data

US 2017/0069654 A1  Mar. 9, 2017

Related U.S. Application Data

(60) Provisional application No. 62/215,493, filed on Sep. 8, 2015.

(51) Int. Cl.
| | | |
|---|---|---|
| *H01L 27/115* | (2017.01) | |
| *H01L 29/792* | (2006.01) | |
| *H01L 27/11582* | (2017.01) | |
| *H01L 49/02* | (2006.01) | |

(52) U.S. Cl.
CPC ...... *H01L 27/11582* (2013.01); *H01L 27/115* (2013.01); *H01L 28/00* (2013.01); *H01L 29/792* (2013.01)

(58) Field of Classification Search
CPC . H01L 27/11582; H01L 27/115–11597; H01L 29/4234–42352; H01L 29/66825–66833; H01L 29/792–7926; H01L 2924/145–145; H01L 27/11563–11582; H01L 29/66833; H01L 21/28282

See application file for complete search history.

(56) References Cited

U.S. PATENT DOCUMENTS

| 8,455,940 | B2 | 6/2013 | Lee et al. |
| 8,723,248 | B2 | 5/2014 | Yasuda et al. |
| 8,809,931 | B2 * | 8/2014 | Nakai ............... H01L 29/788 257/314 |
| 2005/0205969 | A1 | 9/2005 | Ono et al. |
| 2007/0284652 | A1 | 12/2007 | Kobayashi et al. |
| 2008/0135946 | A1 * | 6/2008 | Yan ............... H01L 21/28282 257/390 |
| 2009/0152618 | A1 * | 6/2009 | Matsuo ............ H01L 27/115 257/324 |

(Continued)

*Primary Examiner* — William F Kraig
*Assistant Examiner* — Khatib A Rahman
(74) *Attorney, Agent, or Firm* — Oblon, McClelland, Maier & Neustadt, L.L.P.

(57) ABSTRACT

A semiconductor memory device according to an embodiment includes a substrate, a stacked body provided on the substrate, a plurality of electrode films being stacked to be separated from each other in the stacked body, a semiconductor pillar piercing the plurality of electrode films, a first insulating film provided between the semiconductor pillar and the electrode films, a second insulating film provided between the semiconductor pillar and the first insulating film; and a third insulating film provided between the first insulating film and the electrode films. The first insulating film includes silicon, nitrogen, oxygen, and carbon.

14 Claims, 8 Drawing Sheets

(56) References Cited

U.S. PATENT DOCUMENTS

| | | | |
|---|---|---|---|
| 2010/0317169 A1* | 12/2010 | Sung | H01L 21/26586 438/287 |
| 2012/0276696 A1* | 11/2012 | Yang | H01L 27/11556 438/156 |
| 2013/0175604 A1* | 7/2013 | Polishchuk | H01L 29/792 257/325 |
| 2013/0307053 A1* | 11/2013 | Polishchuk | H01L 29/4234 257/325 |
| 2015/0194440 A1* | 7/2015 | Noh | H01L 29/66833 257/324 |

* cited by examiner

SEMICONDUCTOR MEMORY DEVICE

CROSS-REFERENCE TO RELATED APPLICATIONS

This application is based upon and claims the benefit of priority from U.S. Provisional Patent Application No. 62/215,493, filed on Sep. 8, 2015; the entire contents of which are incorporated herein by reference.

FIELD

Embodiments described herein relate generally to a semiconductor memory device.

BACKGROUND

In recent years, a stacked type semiconductor memory device has been proposed in which memory cells are integrated three-dimensionally. In such a stacked type semiconductor memory device, a stacked body in which electrode films and insulating films are stacked alternately is provided on a semiconductor substrate; and a semiconductor pillar that pierces the stacked body is provided. Also, memory cells are formed at each intersection between the electrode films and the semiconductor pillars. It is a challenge to ensure the retention characteristics of data in such a stacked type semiconductor memory device.

DETAILED DESCRIPTION

A semiconductor memory device according to an embodiment includes a substrate, a stacked body provided on the substrate, a plurality of electrode films being stacked to be separated from each other in the stacked body, a semiconductor pillar piercing the plurality of electrode films, a first insulating film provided between the semiconductor pillar and the electrode films, a second insulating film provided between the semiconductor pillar and the first insulating film; and a third insulating film provided between the first insulating film and the electrode films. The first insulating film includes silicon, nitrogen, oxygen, and carbon.

First Embodiment

First, a first embodiment will be described.

Figure 1:
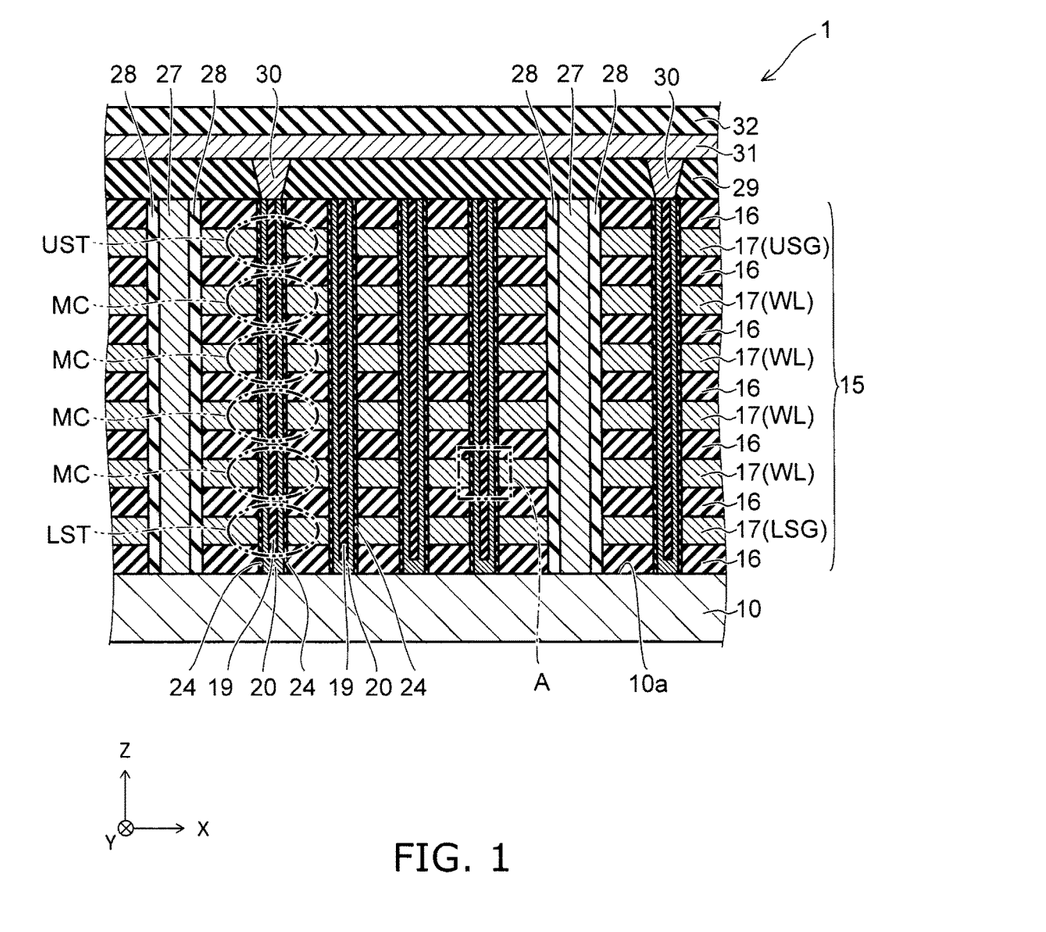
FIG. 1 is a cross-sectional view showing a semiconductor memory device according to a first embodiment.

FIG. 1 is a cross-sectional view showing a semiconductor memory device according to the embodiment.

Figure 2:
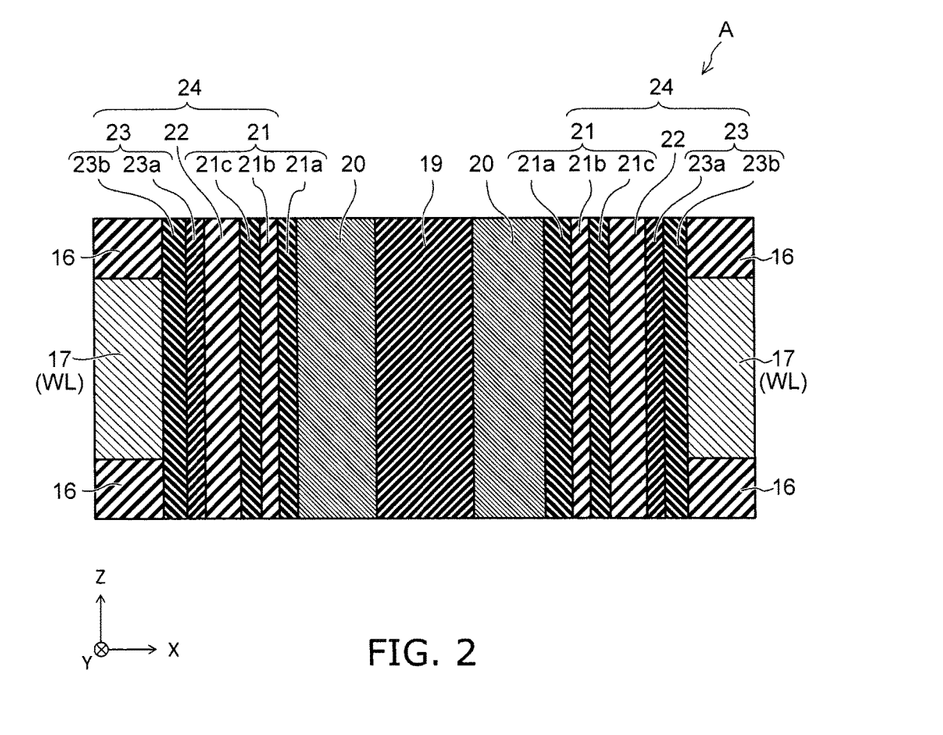
FIG. 2 is a cross-sectional view showing region A of FIG. 1.

FIG. 2 is a cross-sectional view showing region A of FIG. 1.

A silicon substrate 10 is provided in the semiconductor memory device 1 according to the embodiment as shown in FIG. 1. Hereinbelow, an XYZ orthogonal coordinate system is employed in the specification for convenience of description. Two mutually-orthogonal directions parallel to an upper surface 10a of the silicon substrate 10 are taken as an "X-direction" and a "Y-direction;" and a direction perpendicular to the upper surface 10a of the silicon substrate 10 is taken as a "Z-direction." For example, the silicon substrate 10 is formed of a monocrystal of silicon.

A stacked body 15 is provided on the silicon substrate 10. An insulating film 16 and an electrode film 17 are stacked alternately along the Z-direction in the stacked body 15. For example, the insulating film 16 is formed of an insulating material such as silicon oxide, etc.; and, for example, the electrode film 17 is formed of a conductive material such as tungsten, polysilicon, etc. The insulating film 16 may not be provided; and an air gap may be made instead of the insulating film 16.

A silicon pillar 20 that extends in the Z-direction is provided inside the stacked body 15. For example, the silicon pillar 20 is made of polysilicon; and the configuration of the silicon pillar 20 is a circular tube having a plugged lower end. The lower end of the silicon pillar 20 is connected to the silicon substrate 10. For example, a core member 19 that is made of silicon oxide is provided inside the silicon pillar 20. The core member 19 may not be provided.

As shown in FIG. 2, a tunneling insulating film 21 is provided on a side surface of the silicon pillar 20. Although the tunneling insulating film 21 normally is insulative, the tunneling insulating film 21 is a film in which a tunneling current flows when a prescribed voltage within the range of the drive voltage of the semiconductor memory device 1 is applied. For example, a silicon oxide layer 21a, a silicon oxynitride layer 21b, and a silicon oxide layer 21c are stacked in this order in the tunneling insulating film 21.

A charge storage film 22 is provided on a surface of the tunneling insulating film 21. The charge storage film 22 is a film that can store charge and is formed of a material having trap sites of electrons. In the embodiment, the charge storage film 22 is formed of a material including silicon (Si), nitrogen (N), oxygen (O), and carbon (C), i.e., SiOCN. The value of the ratio (N/N+O) of the nitrogen content to the total content of nitrogen and oxygen for the charge storage film 22 is, for example, not less than 0.66 but less than 1; and the carbon content in the charge storage film 22 is, for example, not less than $1 \times 10^{20}$ atoms/cm$^3$ and not more than $9 \times 10^{21}$ atoms/cm$^3$, and more favorably not less than $5 \times 10^{20}$ atoms/cm$^3$ and not more than $7 \times 10^{21}$ atoms/cm$^3$. The film thickness of the charge storage film 22 is, for example, not less than 5 nm and not more than 10 nm.

For example, such a charge storage film 22 can be formed by repeatedly supplying a source gas of silicon, a source gas of oxygen, a source gas of carbon, and a source gas of nitrogen in order in ALD (Atomic Layer Deposition).

A blocking insulating film 23 is provided on a surface of the charge storage film 22. The blocking insulating film 23 is a film in which a current substantially does not flow even when a voltage within the range of the drive voltage of the semiconductor memory device 1 is applied. The blocking insulating film 23 is, for example, a two-layer film in which a silicon oxide layer 23a and an aluminum oxide layer 23b are stacked from the charge storage film 22 side. A memory film 24 that is capable of storing data includes the tunneling insulating film 21, the charge storage film 22, and the blocking insulating film 23. Accordingly, the memory film 24 is disposed between the silicon pillar 20 and the electrode film 17.

Also, as shown in FIG. 1, a source electrode 27 that has a plate configuration is provided inside the stacked body 15. The source electrode 27 pierces the stacked body 15 in the Z-direction and extends in the Y-direction. The lower end of the source electrode 27 is connected to the silicon substrate 10. An insulating plate 28 that is made of, for example, silicon oxide is provided on two side surfaces of the source electrode 27. The insulating film 16 and the electrode film 17 are partitioned by the source electrode 27 and the insulating plate 28 into multiple interconnects extending in the Y-direction. The interconnect of the partitioned electrode film 17 disposed in the lowermost level is used as a lower selection gate electrode LSG; the interconnect of the partitioned electrode film 17 disposed in the uppermost level is used as an upper selection gate electrode USG; and the interconnects of the other partitioned electrode films 17 are used as word lines WL. The lower selection gate electrode LSG and the upper selection gate electrode USG each may be provided in multiple levels.

A memory cell transistor MC having a MONOS (Metal-Oxide-Nitride-Oxide-Silicon) structure with the memory film 24 interposed is configured at each intersection between the silicon pillars 20 and the word lines WL. The memory cell transistors MC are arranged in a three-dimensional matrix configuration because the silicon pillars 20 are arranged in a matrix configuration along the X-direction and the Y-direction and because the word lines WL are arranged along the Z-direction. Also, lower selection transistors LST are configured at the intersections between the lower selection gate electrode LSG and the silicon pillars 20; and upper selection transistors UST are configured at the intersections between the upper selection gate electrode USG and the silicon pillars 20.

Also, an insulating film 29 is provided on the stacked body 15; and a plug 30 is provided inside the insulating film 29. A bit line 31 that extends in the X-direction is provided on the insulating film 29. The bit line 31 is connected to the upper end of the silicon pillar 20 via the plug 30. An insulating film 32 is provided on the insulating film 29 to cover the bit line 31.

Thus, the silicon pillar 20 is connected between the bit line 31 and the silicon substrate 10. Also, the multiple memory cell transistors MC are connected in series along each of the silicon pillars 20; and the lower selection transistor LST and the upper selection transistor UST are connected at the two ends of the multiple memory cell transistors MC. Thereby, a NAND string is formed in which the upper selection transistor UST, the multiple memory cell transistors MC, and the lower selection transistor LST are connected in series between the bit line 31 and the silicon substrate 10.

Operations of the semiconductor memory device according to the embodiment will now be described.

First, a programming operation of data in which electrons are injected into any memory cell will be described briefly.

A control circuit (not shown) applies an ON potential to the lower selection gate electrode LSG and the upper selection gate electrode USG of the NAND string including the memory cell transistor MC to be programmed to switch the lower selection transistor LST and the upper selection transistor UST to ON states. Then, the potential of the silicon pillar 20 is set to a ground potential by, for example, applying a ground potential GVD to the source electrode 27 and the bit line 31. On the other hand, a positive programming potential is applied to the word line WL to be selected; and the ON potential is applied to the unselected word lines WL. The programming potential is higher than the ON potential. Thereby, in the memory cell transistor MC to be programmed, the electrons inside the silicon pillar 20 are injected into the charge storage film 22 via the tunneling insulating film 21. When the electrons are injected into the charge storage film 22, the threshold of the memory cell transistor MC changes. Thereby, the data is programmed to the memory cell transistor MC.

However, in the semiconductor memory device 1, because the multiple memory cell transistors MC that are arranged in the Z-direction share one charge storage film 22, there is a risk that the electrons that are injected into one memory cell transistor MC may be conducted through the charge storage film 22 and may undesirably move into an adjacent memory cell transistor MC. When electrons are thus detrapped, the data that is programmed to the memory cell transistor MC is undesirably lost.

Figure 3:
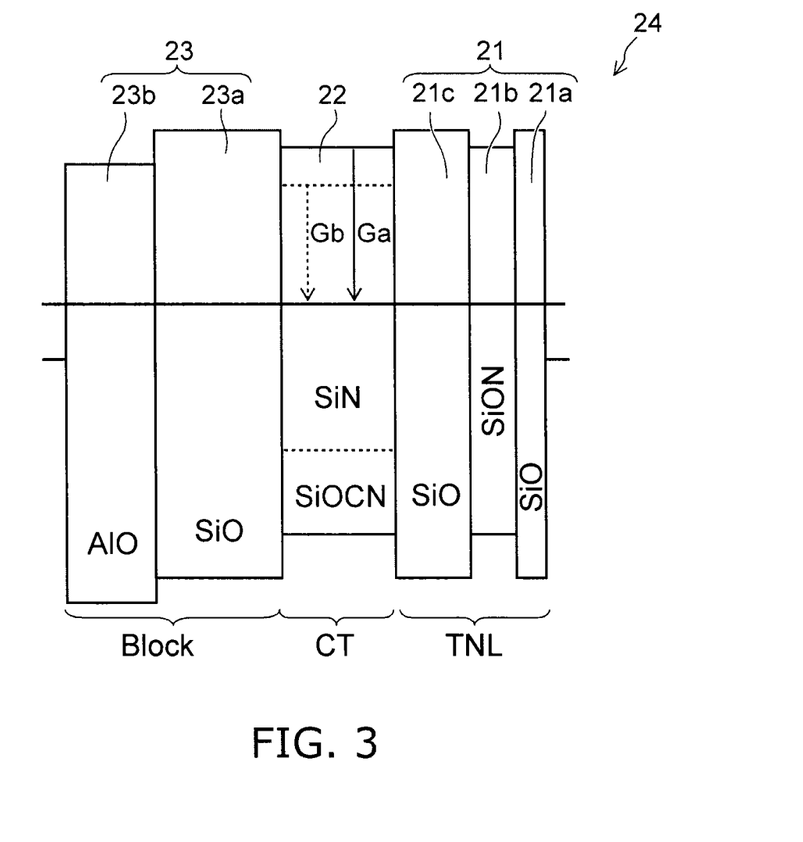
FIG. 3 is a bandgap diagram of a memory film of the semiconductor memory device according to the first embodiment.

FIG. 3 is a bandgap diagram of the memory film of the semiconductor memory device according to the embodiment.

For comparison in FIG. 3, the case where the charge storage film is made of silicon nitride (SiN) is illustrated by broken lines.

In the memory film 24 of the semiconductor memory device 1 according to the embodiment as shown in FIG. 3, the charge storage film 22 is formed of silicon including nitrogen, oxygen, and carbon, i.e., SiOCN. The bandgap of SIOCN is wider than the bandgap of silicon nitride (SiN). This is mainly because oxygen is contained. Therefore, a depth Ga of the energy level of the trap sites as viewed from the conduction band of SiOCN is deeper than a depth Gb of the energy level of the trap sites as viewed from the conduction band of SiN. Thereby, the electrons that are injected into the trap sites of the charge storage film 22 made of SiOCN are trapped inside a high barrier and do not move easily from that position. As a result, for the charge storage film 22 made of SiOCN, the retention performance of electrons is high; and the retention characteristic of the data of the memory cell transistor MC is high.

As described above, while it is effective to widen the bandgap of the charge storage film 22 by oxygen (O) being contained in the silicon nitride (SiN) included in the charge storage film 22, it is favorable for the proportion of oxygen and nitrogen to be within a prescribed range.

Figure 4:
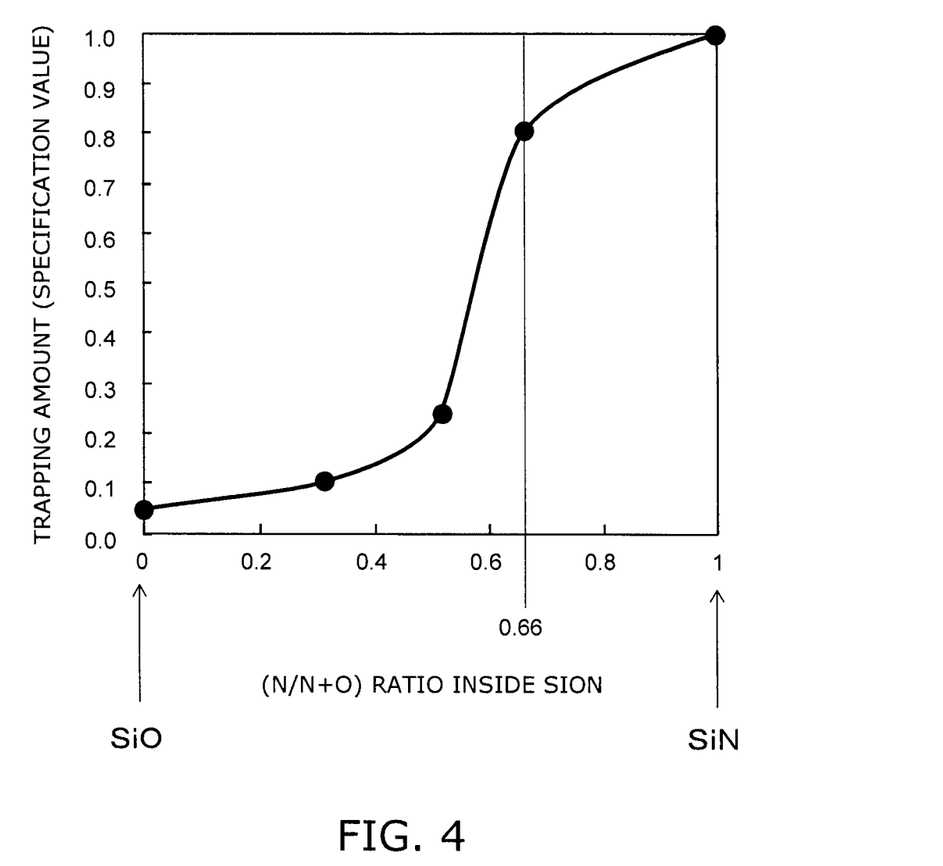
FIG. 4 is a graph showing a relationship between a trapping amount and a composition of SiON, where the horizontal axis is a value of a ratio (N/N+O) of a content of nitrogen to a total content of nitrogen and oxygen for SiON, and the vertical axis is a trapping amount.

FIG. 4 is a graph showing the relationship between the trapping amount and the composition of SiON, where the horizontal axis is the value of the ratio (N/N+O) of the content of nitrogen to the total content of nitrogen and oxygen for SiON, and the vertical axis is the trapping amount.

As shown in FIG. 4, when the oxygen content inside the SiON is too high, the nitrogen content decreases by this amount; and the number of trap sites undesirably decreases. As a result, the electron amount (the trapping amount) that is trapped in the SiON decreases; and the change amount of the threshold due to the programming operation becomes insufficient. Accordingly, the programming characteristics degrade. As shown in FIG. 4, to ensure a sufficient trapping amount, it is favorable for the value of the ratio (N/N+O) to be not less than 0.66 but less than 1.

Also, in the embodiment, the trap sites that have been reduced by oxygen being contained in the charge storage film 22 are supplemented by carbon being contained.

Figure 5:
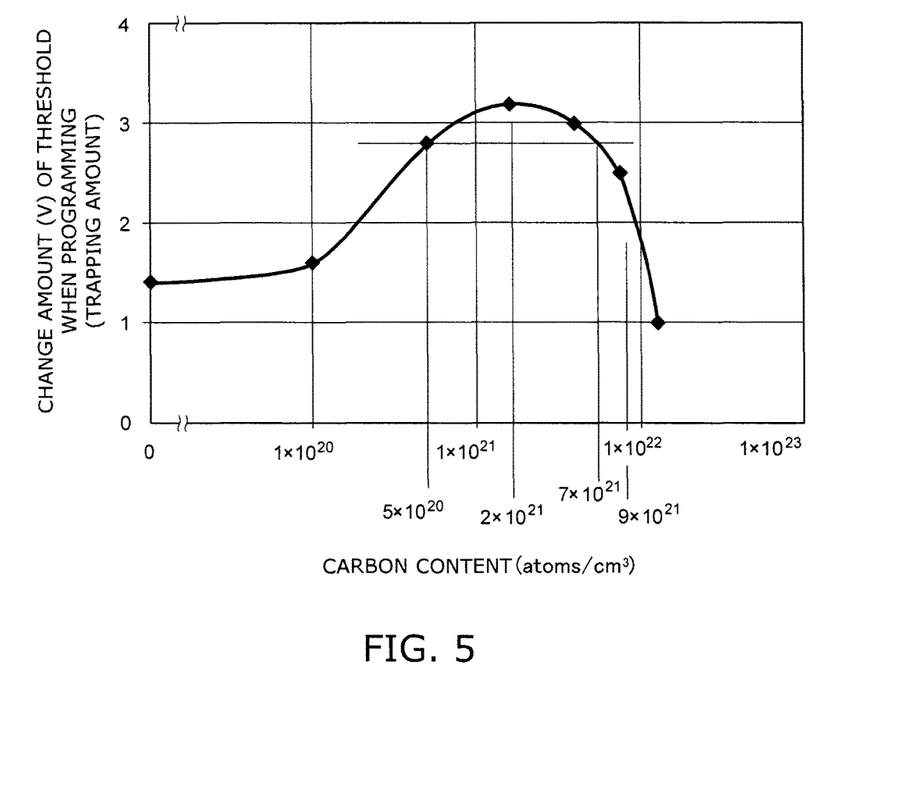
FIG. 5 is a graph showing effects of a carbon content on the trapping amount, where the horizontal axis is a carbon content of a charge storage film, and the vertical axis is a change amount of a threshold of the memory cell transistor when programming.

FIG. 5 is a graph showing the effects of the carbon content on the trapping amount, where the horizontal axis is the carbon content of the charge storage film, and the vertical axis is the change amount of the threshold of the memory cell transistor when programming.

The change amount of the threshold of the vertical axis of FIG. 5 is an amount corresponding to the trapping amount. In other words, if the electron amount that is trapped in the charge storage film becomes high, the change amount of the threshold of the memory cell transistor when programming becomes large.

As shown in FIG. 5, the change amount of the threshold of the memory cell transistor when programming is dependent on the carbon content inside the charge storage film 22. In other words, as the carbon content is increased continuously from the state in which the carbon content is zero, the change amount of the threshold starts to increase from where the carbon content is about $1\times10^{20}$ atoms/cm$^3$; the change amount of the threshold reaches a maximum value at about $2\times10^{21}$ atoms/cm$^3$; the change amount of the threshold decreases as the carbon content is increased further, returns to the same level as $1\times10^{20}$ atoms/cm$^3$ at about $9\times10^{21}$ atoms/cm$^3$; and as the carbon content is increased further, the change amount of the threshold decreases further. Accordingly, it is favorable for the carbon content of the charge storage film 22 to be not less than $1\times10^{20}$ atoms/cm$^3$ and not more than $9\times10^{21}$ atoms/cm$^3$. Also, as shown in FIG. 5, to stabilize the trapping amount in a higher range, it is more favorable for the carbon content of the charge storage film 22 to be not less than $5\times10^{20}$ atoms/cm$^3$ and not more than $7\times10^{21}$ atoms/cm$^3$.

The reason that the trapping amount increases as the carbon content increases in the range where the carbon content is $1\times10^{20}$ atoms/cm$^3$ to $2\times10^{21}$ atoms/cm$^3$ is inferred to be because the carbon atom has four bonds, and dangling bonds that are not bonded to the surrounding atoms occur inside the SiON film and form trap sites. On the other hand, the reason that the trapping amount decreases as the carbon content increases in the range where the carbon content is not less than $2\times10^{21}$ atoms/cm$^3$ is inferred to be because the insulative properties of the charge storage film 22 decrease due to the increase of the carbon, and the electrons move more easily.

Effects of the embodiment will now be described.

In the embodiment as described above, by oxygen being contained in the charge storage film 22 which has silicon nitride (SiN) as the main material, the bandgap of the charge storage film 22 is widened; and the energy level of the trap sites is set to be relatively deep. Thereby, the movement of the electrons that were injected into the charge storage film 22 can be suppressed; and the retention characteristics of the data can be increased. Also, by carbon being contained in the charge storage film 22, the trap sites that decreased due to the oxygen being contained can be increased; the trapping amount of the electrons can be increased; and the change amount of the threshold when programming can be ensured. Thereby, the programming characteristics can be increased. Thus, according to the embodiment, a semiconductor memory device in which the programming characteristics and the retention characteristics of the data are good can be realized.

Also, because the dielectric constant of SiOCN is higher than the dielectric constant of SiN, for the same physical film thickness of the charge storage film, the electrical film thickness of the charge storage film made of SiOCN is thicker than the electrical film thickness of the charge storage film made of SiN. Therefore, the gradient of the potential, i.e., the electric field, for the physical film thickness is weaker for the charge storage film made of SiOCN than for the charge storage film made of SiN; and accordingly, the electromagnetic force that is applied to the electrons from the electric field also is weak. For this reason as well, the movement of the electrons can be suppressed.

Test Example

A test example showing effects of the embodiment will now be described.

Figure 6A:
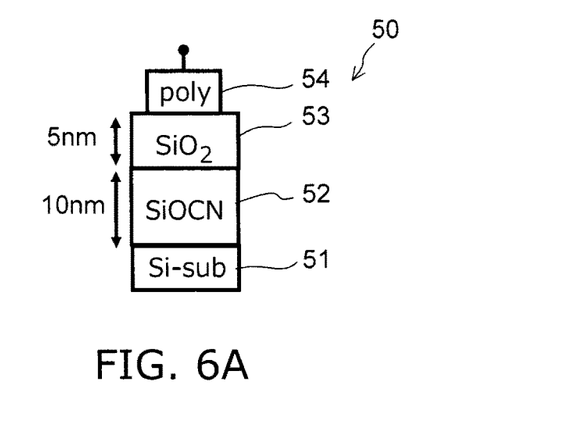
FIG. 6A is a cross-sectional view showing a sample used in a test example.

FIG. 6A is a cross-sectional view showing a sample used in the test example.

Figure 6B:
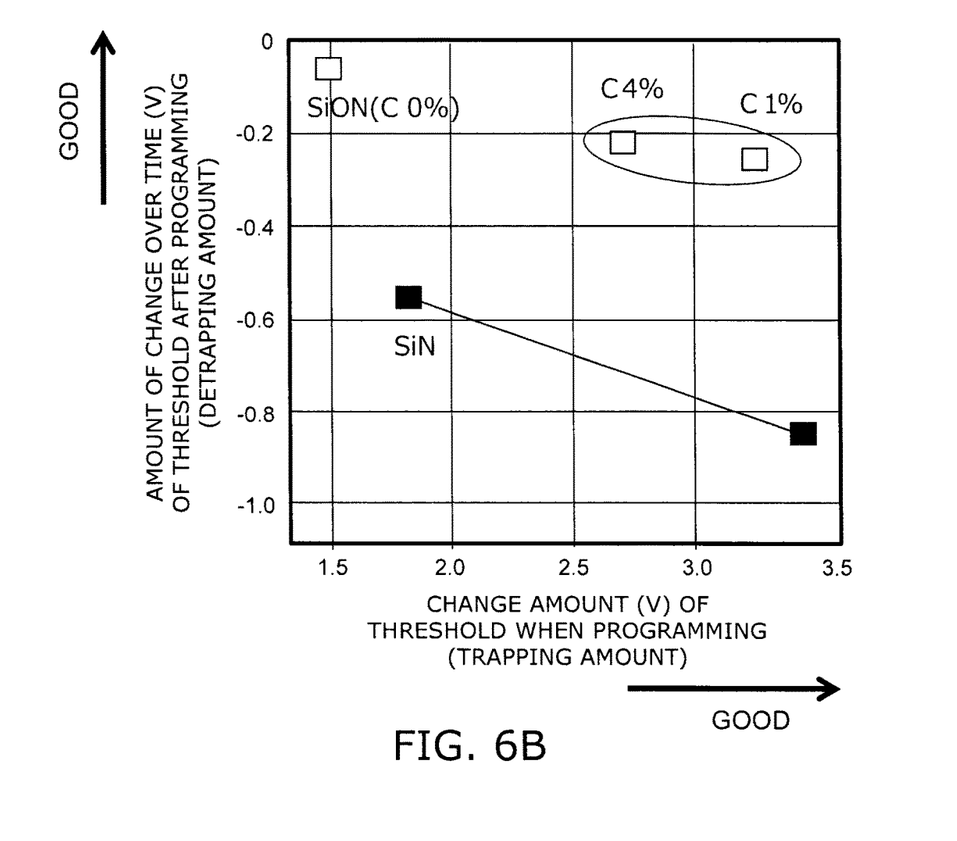
FIG. 6B is a graph showing a relationship between a composition of the charge storage film, the trapping amount, and the detrapping amount, where the horizontal axis is the change amount of the threshold when programming, and the vertical axis is an amount of change over time of the threshold after programming.

FIG. 6B is a graph showing the relationship between the composition of the charge storage film, the trapping amount, and the detrapping amount, where the horizontal axis is the change amount of the threshold when programming, and the vertical axis is the amount of change over time of the threshold after programming.

As described above, the change amount of the threshold when programming has a positive correlation with the trapping amount. The programming characteristics are better and it is more favorable as the change amount of the threshold when programming increases. Also, the amount of change over time of the threshold after programming indicates the detrapping amount. In other words, by the electrons detrapping gradually, the threshold that was increased by the programming operation changes over time and undesirably returns to the original. Accordingly, the retention characteristics of the data are higher and it is more favorable when the detrapping amount, i.e., the amount of change over time of the threshold after programming, decreases.

In the test example as shown in FIG. 6A, a field effect transistor 50 that includes the charge storage film was made as the sample. Namely, a charge storage film 52 having a thickness of 10 nm was formed on a silicon substrate 51 in which source/drain regions (not shown) were formed; a silicon oxide film 53 having a thickness of 5 nm was formed on the charge storage film 52; and an electrode 54 that was made of polysilicon was formed on the silicon oxide film 53.

The composition of the charge storage film 52 was different for each sample and was SiN, SiON, and SiOCN. The carbon concentration of the SiOCN was set to 1 atomic % and 4 atomic %.

Then, a threshold Vth1 of the transistor 50 was measured. Then, the programming operation to the transistor 50 was performed; and the charge was trapped in the charge storage film 52. Directly thereafter, a threshold Vth2 after programming the transistor 50 was measured. Subsequently, after 1 hour elapsed, a threshold Vth3 of the transistor 50 was measured. Then, the value of (Vth2−Vth1) was used as the change amount of the threshold when programming; and the value of (Vth3−Vth2) was used as the amount of change over time of the threshold after programming.

As shown in FIG. 6B, the change amount of the threshold when programming, i.e., the trapping amount, was equivalent but the amount of change over time of the threshold after programming, i.e., the detrapping amount, was lower for the case where the charge storage film 52 is made of SiOCN containing 1 atomic % or 4 atomic % of carbon than for the case where the charge storage film 52 was made of SiN. In other words, compared to the case where the charge storage film 52 was made of SiN, the programming characteristics were equivalent and the data retention characteristics were better for the case where the charge storage film 52 was made of SiOCN.

Also, the amount of change over time of the threshold after programming, i.e., the detrapping amount, was equivalent and the change amount of the threshold when programming, i.e., the trapping amount, was higher for the case where the charge storage film 52 was made of SiOCN than for the case where the charge storage film 52 was made of SiON. In other words, compared to the case where the charge storage film 52 was made of SiON, the data retention characteristics were equivalent and the programming characteristics were better for the case where the charge storage film 52 was made of SiOCN.

Second Embodiment

A second embodiment will now be described.

Figure 7A:
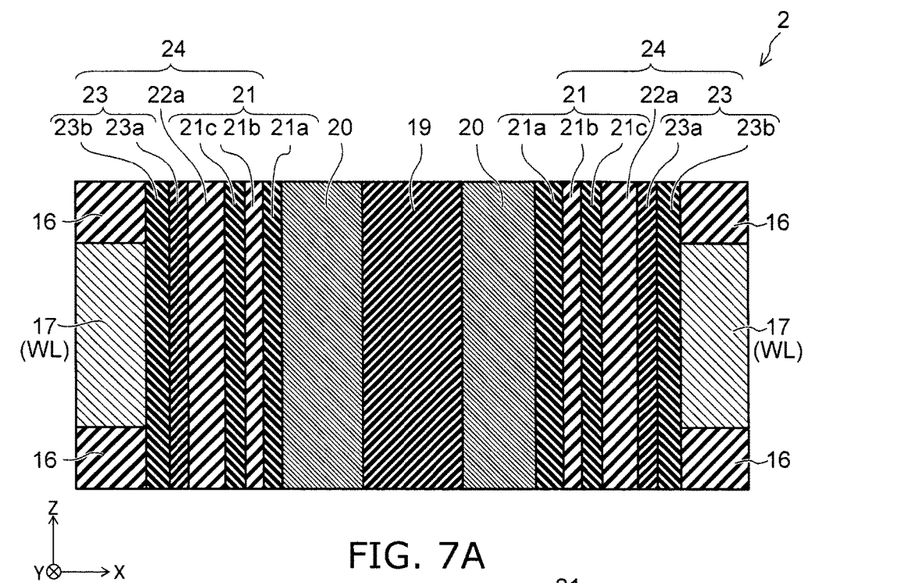
FIG. 7A is a cross-sectional view showing a semiconductor memory device according to a second embodiment.

FIG. 7A is a cross-sectional view showing a semiconductor memory device according to the embodiment.

Figures 7B, 7C:
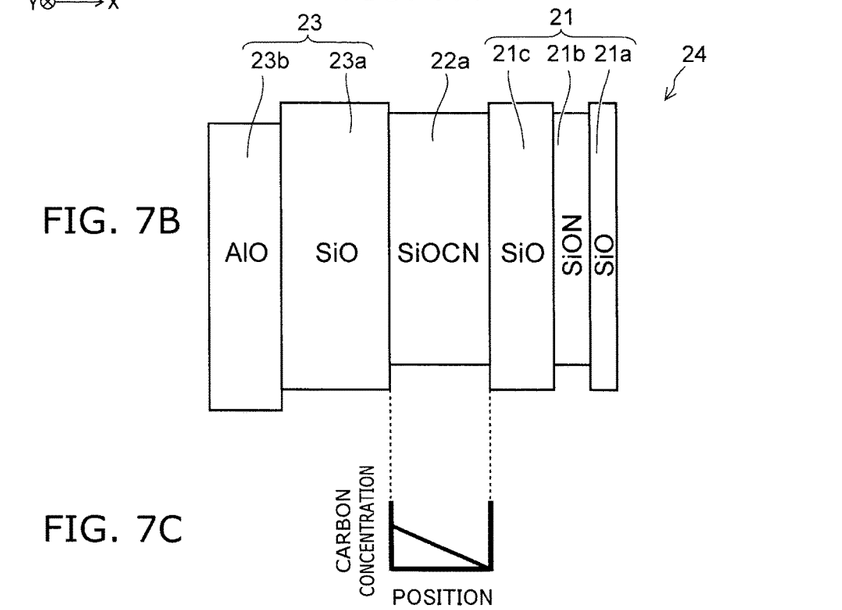
FIG. 7B is a bandgap diagram of a memory film of the semiconductor memory device according to the second embodiment.
FIG. 7C is a graph showing a carbon concentration distribution inside a charge storage film, where the horizontal axis is a position in a film thickness direction of the charge storage film, and the vertical axis is the carbon concentration.

FIG. 7B is a bandgap diagram of the memory film of the semiconductor memory device according to the embodiment.

FIG. 7C is a graph showing the carbon concentration distribution inside the charge storage film, where the horizontal axis is the position in the film thickness direction of the charge storage film, and the vertical axis is the carbon concentration.

FIG. 7A shows a region corresponding to region A of FIG. 1.

As shown in FIG. 7A and FIG. 7B, the semiconductor memory device 2 according to the embodiment differs from the semiconductor memory device 1 according to the first embodiment described above (referring to FIG. 2) in that a charge storage film 22a is provided instead of the charge storage film 22.

In the charge storage film 22a as shown in FIG. 7C, the carbon concentration has a gradient in the film thickness direction; and the carbon concentration of the portion of the charge storage film 22a contacting the blocking insulating film 23 is higher than the carbon concentration of the portion of the charge storage film 22a contacting the tunneling insulating film 21. More specifically, the carbon concentration of the charge storage film 22a increases continuously from the interface between the charge storage film 22a and the tunneling insulating film 21 toward the interface between the charge storage film 22a and the blocking insulating film 23.

The effect on the threshold of the memory cell transistor MC due to one electron stored in the charge storage film increases as the position of the electron approaches the tunneling insulating film 21. Therefore, in the embodiment, by setting the carbon concentration of the charge storage film 22a to be relatively high on the blocking insulating film 23 side and relatively low on the tunneling insulating film 21 side, the greater part of the electrons stored in the charge storage film 22a are distal to the tunneling insulating film 21. Thereby, the change amount of the threshold when a constant number of electrons are detrapped can be suppressed.

Otherwise, the configuration, the manufacturing method, the operations, and the effects of the embodiment are similar to those of the first embodiment described above.

Third Embodiment

A third embodiment will now be described.

Figure 8A:
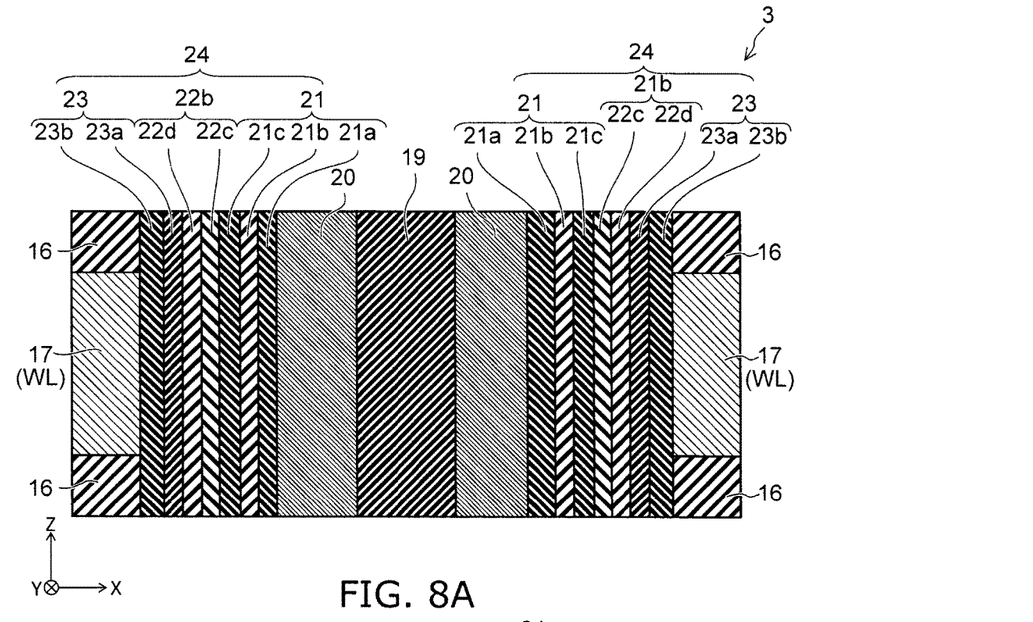
FIG. 8A is a cross-sectional view showing a semiconductor memory device according to a third embodiment.

FIG. 8A is a cross-sectional view showing a semiconductor memory device according to the embodiment.

Figure 8B:
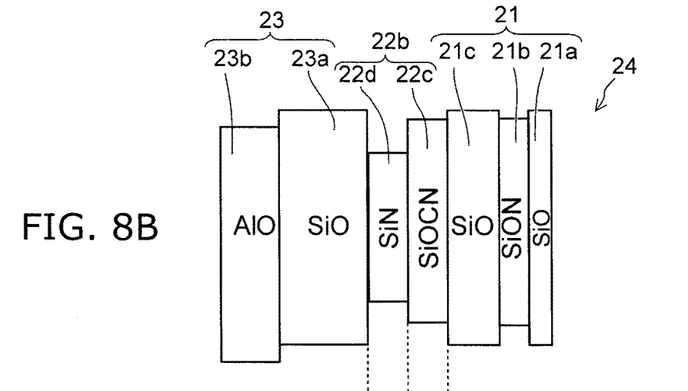
FIG. 8B is a bandgap diagram of a memory film of the semiconductor memory device according to the third embodiment.

FIG. 8B is a bandgap diagram of the memory film of the semiconductor memory device according to the embodiment.

Figure 8C:
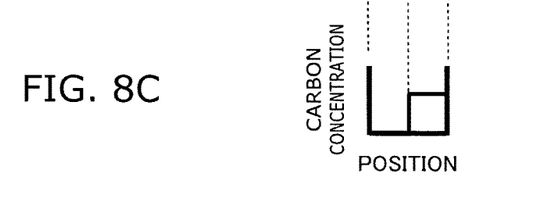
FIG. 8C is a graph showing a carbon concentration distribution inside a charge storage film, where the horizontal axis is a position in a film thickness direction of the charge storage film, and the vertical axis is the carbon concentration.

FIG. 8C is a graph showing the carbon concentration distribution inside the charge storage film, where the horizontal axis is the position in the film thickness direction of the charge storage film, and the vertical axis is the carbon concentration.

FIG. 8A shows a region corresponding to region A of FIG. 1.

As shown in FIG. 8A to FIG. 8C, the semiconductor memory device 3 according to the embodiment differs from the semiconductor memory device 1 according to the first embodiment described above (referring to FIG. 2) in that a charge storage film 22b is provided instead of the charge storage film 22. A SiOCN layer 22c that is made of SiOCN and disposed on the tunneling insulating film 21 side, and a SiN layer 22d that is made of SiN and disposed on the blocking insulating film 23 side are provided in the charge storage film 22b. The SiOCN layer 22c and the SiN layer 22d contact each other. The oxygen concentration of the SiOCN layer 22c is higher than the oxygen concentration of the SiN layer 22d; and the carbon concentration of the SiOCN layer 22c is higher than the carbon concentration of the SiN layer 22d.

Thereby, in the embodiment, the detrapping is suppressed only for the electrons stored on the tunneling insulating film 21 side of the charge storage film 22b, i.e., the electrons stored in the SiOCN layer 22c. As a result, the detrapping of the electrons that have a large effect on the threshold of the memory cell transistor MC when detrapped can be suppressed because the electrons are disposed at a position proximal to the tunneling insulating film 21.

Otherwise, the configuration, the manufacturing method, the operations, and the effects of the embodiment are similar to those of the first embodiment described above.

According to how the coupling is performed, there is also a possibility of the detrapping of the electrons from the charge storage film passing through toward the tunneling insulating film 21 side and a possibility of passing through toward the blocking insulating film 23 side as well. Therefore, the charge storage film may be a two-layer film in which a SiN layer is disposed on the tunneling insulating film 21 side, and a SiOCN layer is disposed on the blocking insulating film 23 side. Also, the charge storage film may be a three-layer film in which a SiOCN layer, a SiN layer, and a SiOCN layer are stacked in this order. Further, due to similar reasons, the charge storage film may be formed of a single-layer SiOCN film; the carbon concentration on the tunneling insulating film 21 side may be set to be higher than the carbon concentration on the blocking insulating film 23 side; the carbon concentration at two side surface portions in the film thickness direction may be set to be higher than the carbon concentration of the central portion; or the carbon concentration of the central portion in the film thickness direction may be set to be higher than the carbon concentration of the two side surface portions in the film thickness direction.

Also, instead of carbon, the charge storage film may contain a metallic element to form a metal oxide having a high trap site amount. For example, aluminum (Al), magnesium (Mg), yttrium (Y), hafnium (Hf), zirconium (Zr), or lanthanum (La) may be contained inside the SiON film. Thereby, the oxides of these metals form trap sites and improve the programming characteristics.

According to the embodiments described above, a semiconductor memory device in which the programming characteristics and the retention characteristics of the data are high can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device, comprising:
a substrate;
a stacked body provided on the substrate, a plurality of electrode films and a plurality of fourth insulating films being alternately stacked in the stacked body;
a semiconductor pillar piercing the stacked body;
a first insulating film provided between the semiconductor pillar and the electrode films and between the semiconductor pillar and the fourth insulating films, the first insulating film including silicon, nitrogen, oxygen, and carbon, the first insulating film having uniform composition along a long axis direction of the semiconductor pillar;
a second insulating film provided between the semiconductor pillar and the first insulating film; and
a third insulating film provided between the first insulating film and the electrode films;
wherein a carbon content of the first insulating film is not less than $1 \times 10^{20}$ atoms/cm$^3$ and not more than $9 \times 10^{21}$ atoms/cm$^3$, and
wherein a carbon concentration of the first insulating film increases continuously from an interface between the first insulating film and the second insulating film toward an interface between the first insulating film and the third insulating film.

2. The semiconductor memory device according to claim 1, wherein a carbon content of the first insulating film is not less than $5 \times 10^{20}$ atoms/cm$^3$ and not more than $7 \times 10^{21}$ atoms/cm$^3$.

3. The semiconductor memory device according to claim 1, wherein the value of a ratio of a nitrogen content to a total content of nitrogen and oxygen for the first insulating film is not less than 0.66 but less than 1.

4. The semiconductor memory device according to claim 1, wherein
the first insulating film includes:
a first layer; and
a second layer, and
an oxygen concentration of the first layer is higher than an oxygen concentration of the second layer, and
a shortest distance between the first layer and the semiconductor pillar is shorter than a shortest distance between the second layer and the semiconductor pillar.

5. A semiconductor memory device, comprising:
a substrate;
a stacked body provided on the substrate, a plurality of electrode films and a plurality of fourth insulating films being alternately stacked in the stacked body;
a semiconductor pillar piercing the stacked body;
a first insulating film provided between the semiconductor pillar and the electrode films and between the semiconductor pillar and the fourth insulating films, the first insulating film including silicon, nitrogen, oxygen, and carbon;
a second insulating film provided between the semiconductor pillar and the first insulating film; and
a third insulating film provided between the first insulating film and the electrode films, wherein
the first insulating film includes:
a first layer; and
a second layer, and
a carbon concentration of the first layer is higher than a carbon concentration of the second layer, and
a shortest distance between the first layer and the semiconductor pillar is shorter than a shortest distance between the second layer and the semiconductor pillar.

6. The semiconductor memory device according to claim 1, wherein the second insulating film includes silicon and oxygen.

7. The semiconductor memory device according to claim 1, wherein
the third insulating film includes:
a third layer including a metal and oxygen; and
a fourth layer disposed between the first insulating film and the third layer, the fourth layer including silicon and oxygen.

8. The semiconductor memory device according to claim 5, wherein a carbon content of the first insulating film is not less than $1 \times 10^{20}$ atoms/cm$^3$ and not more than $9 \times 10^{21}$ atoms/cm$^3$.

9. The semiconductor memory device according to claim 8, wherein a carbon content of the first insulating film is not less than $5 \times 10^{20}$ atoms/cm$^3$ and not more than $7 \times 10^{21}$ atoms/cm.

10. The semiconductor memory device according to claim 5, wherein the value of a ratio of a nitrogen content to a total content of nitrogen and oxygen for the first insulating film is not less than 0.66 but less than 1.

11. The semiconductor memory device according to claim 5, wherein
the first insulating film includes:
a first layer; and a second layer, and an oxygen concentration of the first layer is higher than an oxygen concentration of the second layer, and a shortest distance between the first layer and the semiconductor pillar is shorter than a shortest distance between the second layer and the semiconductor pillar.

12. The semiconductor memory device according to claim 5, wherein the first insulating film includes:

a first layer disposed on the second insulating film side and made of SiOCN; and a second layer disposed on the third insulating film side and made of SiN.

13. The semiconductor memory device according to claim 5, wherein the second insulating film includes silicon and oxygen.

14. The semiconductor memory device according to claim 5, wherein the third insulating film includes:

a third layer including a metal and oxygen; and a fourth layer disposed between the first insulating film and the third layer, the fourth layer including silicon and oxygen.

* * * * *